United States Patent
Brederlow et al.

(10) Patent No.: US 10,545,752 B2
(45) Date of Patent: *Jan. 28, 2020

(54) FERROELECTRIC MEMORY EXPANSION FOR FIRMWARE UPDATES

(71) Applicant: Texas Instruments Incorporated, Dallas, TX (US)

(72) Inventors: Ralf Brederlow, Poing (DE); Oscar Miguel Guillen-Hernandez, Munich (DE); Peter Wongeun Chung, Frisco, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 16/182,138

(22) Filed: Nov. 6, 2018

(65) Prior Publication Data

US 2019/0087171 A1    Mar. 21, 2019

Related U.S. Application Data

(63) Continuation of application No. 15/139,865, filed on Apr. 27, 2016, now Pat. No. 10,120,674.

(60) Provisional application No. 62/169,930, filed on Jun. 2, 2015.

(51) Int. Cl.
  *G11C 11/22* (2006.01)
  *G06F 8/65* (2018.01)

(52) U.S. Cl.
  CPC ........... *G06F 8/65* (2013.01); *G11C 11/221* (2013.01); *G11C 11/225* (2013.01); *G11C 11/2253* (2013.01)

(58) Field of Classification Search
  None
  See application file for complete search history.

(56) References Cited

U.S. PATENT DOCUMENTS

| 5,751,628 A | 5/1998 | Hirano et al. |
| 6,141,247 A | 10/2000 | Roohparvar et al. |
| 6,330,696 B1 | 12/2001 | Zorian et al. |
| 2003/0210584 A1 | 11/2003 | Allen et al. |
| 2005/0057955 A1 | 3/2005 | Oikawa |
| 2010/0006942 A1 | 1/2010 | Park et al. |

(Continued)

OTHER PUBLICATIONS

Zwerg et al., "An 82uA/MHz Microcontroller with Embedded FeRAM for Energy-Harvesting Applications", Paper 19.2, Int'l Solid State Circ. Conf. (IEEE, 2011), pp. 334-335.

*Primary Examiner* — Douglas King
(74) *Attorney, Agent, or Firm* — Rose Alyssa Keagy; Charles A. Brill; Frank D. Cimino (57) ABSTRACT

An integrated circuit including a ferroelectric random access memory (FRAM) for storing firmware, and a method of updating that firmware. The FRAM is constructed to selectively operate as a 2T2C FRAM memory in a normal operating mode, and as a 1T1C FRAM memory in an update mode. Updating of the stored firmware is performed by placing the FRAM in its update (1T1C) mode and writing the updated code into alternate rows of the 1T1C half-cells at each of a plurality of memory locations, while the other 1T1C half-cells in the other alternate rows retain the original data. Following verification of the updated contents, the original data in the other half-cells are overwritten with the verified updated data, and the operating mode is changed back to the normal (2T2C) operating mode.

8 Claims, 9 Drawing Sheets

(56) References Cited

U.S. PATENT DOCUMENTS

2011/0044087 A1     2/2011    Shiga et al.
2012/0127777 A1     5/2012    Rodriguez

FERROELECTRIC MEMORY EXPANSION FOR FIRMWARE UPDATES

CROSS-REFERENCE TO RELATED APPLICATIONS

This application is a continuation of U.S. Nonprovisional patent application Ser. No. 15/139,865, filed Apr. 27, 2016, which claims the benefit of U.S. Provisional Application Ser. No. 62/169,930, filed Jun. 2, 2015, the contents of both of which are herein incorporated by reference in its entirety.

STATEMENT REGARDING FEDERALLY SPONSORED RESEARCH OR DEVELOPMENT

Not applicable.

BACKGROUND OF THE INVENTION

This invention is in the field of electronic systems incorporating embedded ferroelectric memory resources. Embodiments are directed to such systems and methods of operating the same to update the contents of those embedded memory resources.

Conventional metal-oxide-semiconductor (MOS) and complementary MOS (CMOS) logic and memory devices are prevalent in modern electronic systems, as they provide an excellent combination of fast switching times and low power dissipation, along with their high density and suitability for large-scale integration. As is fundamental in the art, however, those devices are essentially volatile, in that logic and memory circuits constructed according to these technologies do not retain their data states upon removal of bias power. Especially in mobile and miniature systems, the ability to store memory and logic states in a non-volatile fashion is very desirable. As a result, various technologies for constructing non-volatile devices have recently been developed.

A recently developed technology for realizing non-volatile solid-state memory devices involves the construction of capacitors in which the dielectric material is a polarizable ferroelectric material, such as lead zirconate titanate (PZT) or strontium-bismuth-tantalate (SBT), rather than silicon dioxide or silicon nitride as typically used in non-ferroelectric capacitors. Hysteresis in the charge-vs.-voltage (Q-V) characteristic, based on the polarization state of the ferroelectric material, enables the non-volatile storage of binary states in those capacitors. In contrast, conventional MOS capacitors lose their stored charge on power-down of the device. It has been observed that ferroelectric capacitors can be constructed by processes that are largely compatible with modern CMOS integrated circuits, for example by placing the capacitors above the transistor level, between overlying levels of metal conductors.

Figure 1:
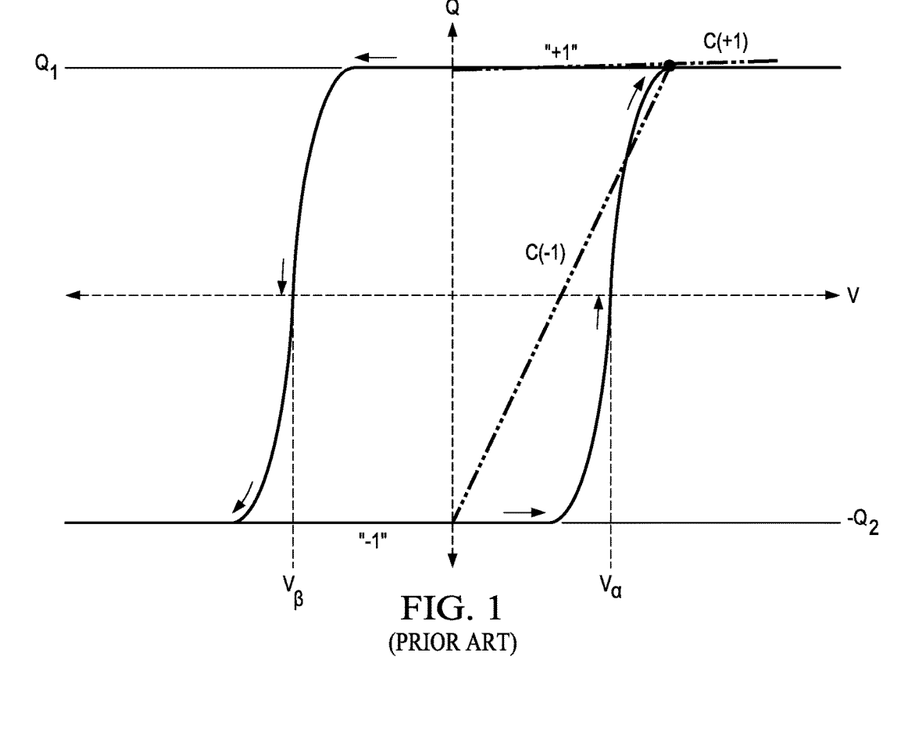
FIG. 1 is a plot of a charge-vs.-voltage characteristic of a conventional ferroelectric capacitor.

FIG. 1 illustrates an example of a Q-V characteristic of a conventional ferroelectric capacitor. As shown, the charge (Q) stored across the conductive plates depends on the voltage applied to the plates (V), and also on the recent history of that voltage. If the voltage V applied across the capacitor plates exceeds a "coercive" voltage $+V_\alpha$, the capacitor polarizes into the "+1" state. According to this characteristic, once polarized to the "+1" state, so long as voltage V remains above coercive voltage $-V_\beta$, the capacitor exhibits a stored charge of $+Q_1$. Conversely, if the voltage V applied across the capacitor plates is more negative than coercive voltage $-V_\beta$, the capacitor is polarized into the "−1" state, and will exhibit a stored charge of $-Q_2$ for applied voltage V below $+V_\alpha$.

An important characteristic of ferroelectric capacitors, for purposes of non-volatile storage in integrated circuits, is the difference in capacitance exhibited by a ferroelectric capacitor between its polarized states. As fundamental in the art, the capacitance of an element refers to the ratio of stored charge to applied voltage. In the context of a ferroelectric capacitor, the change in polarization state that occurs upon application of a polarizing voltage is reflected in charge storage. For example, referring to FIG. 1, the polarization of a ferroelectric capacitor from its "−1" state to its "+1" state is reflected in a relatively high capacitance C(−1), by way of which polarization charge involved in the change of polarization state is retained within the capacitor as the voltage exceeds its coercive voltage $V_\alpha$; on the other hand, a capacitor already in its "+1" state exhibits little capacitance C(+1) due to polarization, since its ferroelectric domains are already aligned prior to the application of the voltage. In each case, the ferroelectric capacitor also has a linear capacitance, by virtue of its construction as parallel plates separated by a dielectric film (i.e., the ferroelectric material). As will be evident from the following description, a stored logic state is read by interrogating the capacitance of ferroelectric capacitors to discern its polarized state.

Ferroelectric technology is now used to realize non-volatile solid-state read/write random access memories (RAMs). These memory resources, commonly referred to as "ferroelectric RAM", or "FeRAM", or "FRAM", are now commonplace in many electronic systems, particularly portable electronic devices and systems. FRAMs are especially attractive in implantable medical devices, such as pacemakers, defibrillators, and monitoring devices, due to the ultra-low power consumption of FRAM memory.

Figure 2A:
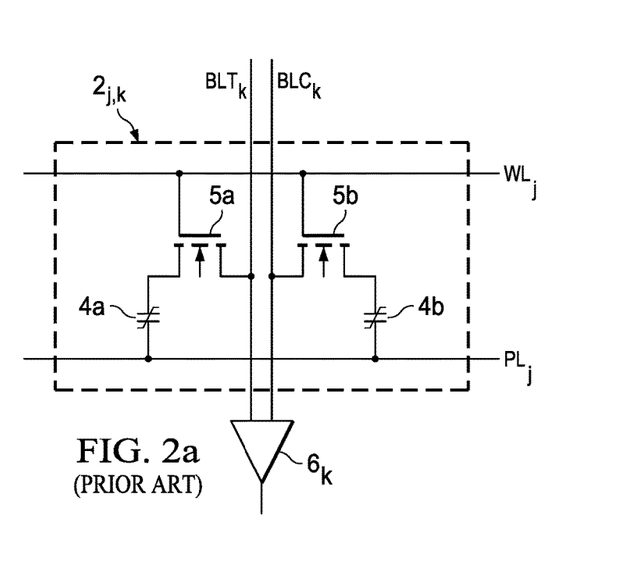
FIG. 2a is an electrical diagram, in schematic and block form, illustrating a conventional 2T-2C ferroelectric memory cell and its operation.

One approach to the implementation of FRAMs is the two-transistor, two-capacitor (2T2C) ferroelectric memory cell, in which the two ferroelectric capacitors in a cell are polarized to complementary states. FIG. 2a schematically illustrates memory cell $2_{j,k}$ of conventional 2T2C construction. In this example, cell $2_{j,k}$ resides in a row j and a column k of a memory array, and includes two ferroelectric capacitors 4a, 4b and two metal-oxide semiconductor (MOS) transistor 5a, 5b. Ferroelectric capacitors 4a, 4b are parallel-plate capacitors with ferroelectric material, such as PZT, as the dielectric; one or both of the plates may be formed in semiconductor material (e.g., a diffused region in the substrate, polysilicon, etc.) or in a metal or conductive metal compound material (e.g., a silicide, or conductive nitride). One plate of each of ferroelectric capacitors 4a, 4b is connected to plate line $PL_j$ for row j. The other plate of ferroelectric capacitor 4a is connected to bit line $BLT_k$ for column k via the source/drain path of p-channel transistor 5a; similarly, the second plate of ferroelectric capacitor 4b is connected to bit line $BLC_k$ via the source/drain path of n-channel transistor 5b. The gates of transistors 5a, 5b are driven by word line $WL_j$ for row j of the memory array.

In operation, ferroelectric capacitors 4a, 4b store complementary polarization states that are reflected as a differential voltage or current between bit lines $BLT_k$, $BLC_k$ when read. As such, a write operation to conventional memory cell $2_{j,k}$ consists of applying complementary levels to bit lines $BLT_k$, $BLC_k$ at a polarity corresponding to the desired data state, while word line $WL_j$ is driven active high to turn on transistors 5a, 5b; a pulse at plate line $PL_j$ during this state causes opposite polarization voltages to polarize capacitors 4a, 4b into the corresponding complementary polarization states. In a read operation, bit lines $BLT_k$, $BLC_k$ are precharged to a selected voltage and then float, after which word line $WL_j$ is asserted active high. A pulse at plate line $PL_j$ causes the complementary polarization states of capacitors $4a$, $4b$ to be reflected as a differential signal across bit lines $BLT_k$, $BLC_k$, respectively, for sensing and amplification by sense amplifier $6_k$ for column k.

Figure 2B:
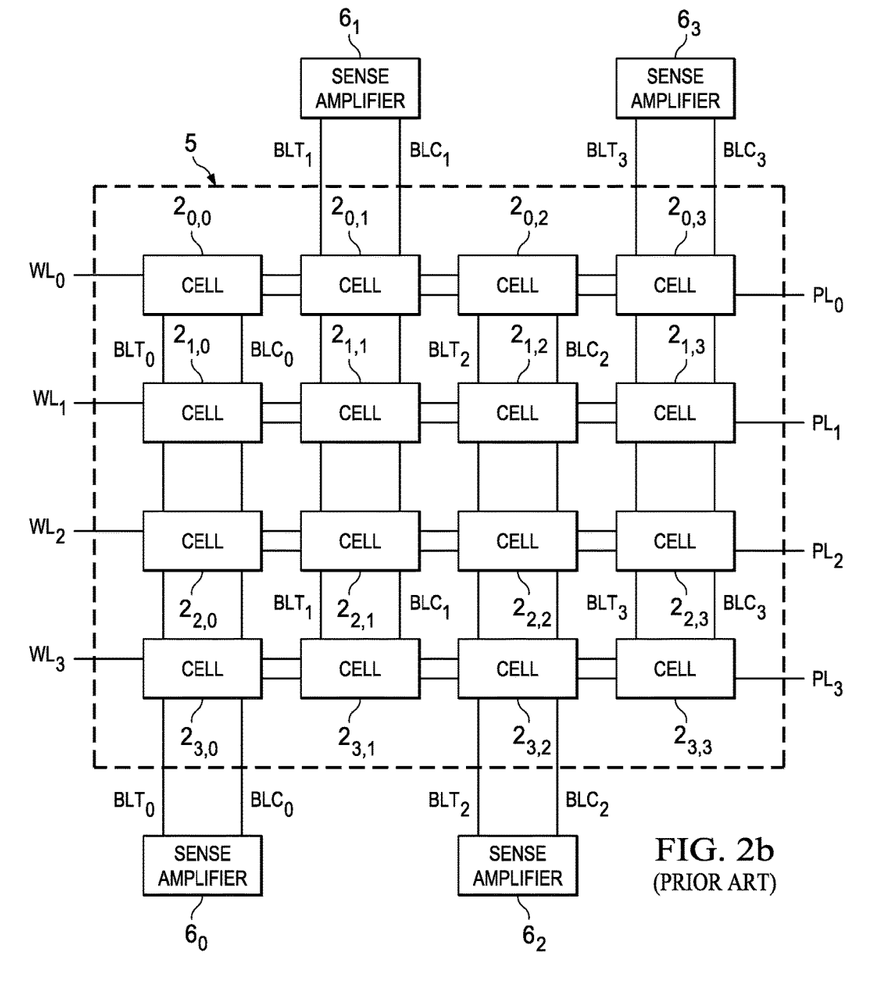
FIG. 2b is an electrical diagram, in block form, of the architecture of a conventional ferroelectric random access memory (FRAM) array.

FIG. 2b illustrates, in block form, a simplified arrangement of conventional memory array 5 of memory cells 2 such as constructed according to FIG. 2a. Of course, memory arrays in actual integrated circuits are much larger than that shown in FIG. 3; this small (4 by 4) example is provided for illustration only. In array 5 of FIG. 3, each row of cells 2 in the array is associated with a corresponding one of word lines $WL_0$ through $WL_3$ and one of plate lines $PL_0$ through $PL_3$. Each column of cells 2 share a pair of bit lines, with column 0 coupled to bit lines $BLT_0$, $BLC_0$; column 1 coupled to bit lines $BLT_1$, $BLC_1$, and so on. Sense amplifier $6_0$ receives bit lines $BLT_0$, $BLC_0$, sense amplifier $6_1$ receives bit lines $BLT_1$, $BLC_1$, sense amplifier $6_2$ receives bit lines $BLT_2$, $BLC_2$, and sense amplifier $6_3$ receives bit lines $BLT_3$, $BLC_3$. Accordingly, the energizing of word line $WL_j$ and plate line $PL_j$ for row j of cells 2 will cause the read or write (as the case may be) of data from or to cells $2_{j,0}$ through $2_{j,3}$, via bit lines pairs $BLT_0$, $BLC_0$ through $BLT_3$, $BLC_3$, respectively.

The conventional 2T2C arrangement of FIGS. 2a and 2b has been observed to provide good long term data retention because of the robust read margin resulting from the differential sense arrangement. Even if one of ferroelectric capacitors $4a$, $4b$ in a given cell $2_{j,k}$ is weak when manufactured, or suffers a significant loss of polarization during the operating life of the device, the cell can still return the correct data state so long as the opposing capacitor retains a stronger polarized state.

Figure 2C:
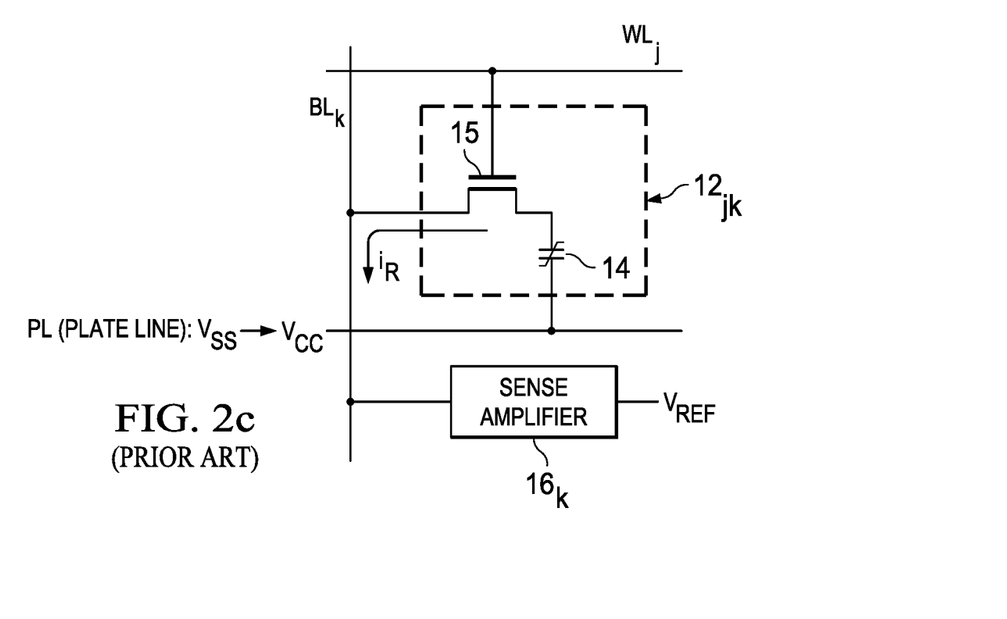
FIG. 2c is an electrical diagram, in schematic and block form, illustrating a conventional 1T-1C ferroelectric memory cell and its operation.

In contrast, ferroelectric cells constructed in a 1T1C (one transistor, one capacitor) arrangement, similar to conventional dynamic RAM memory cells, are attractive because of their small chip area. FIG. 2c illustrates a typical arrangement of a conventional 1T-1C FRAM cell $12_{j,k}$, which represents a single cell residing in a row j and a column k of an array of similar cells 12. Cell $12_{j,k}$ includes ferroelectric capacitor 14 and n-channel pass transistor 15. The source/drain path of transistor 15 is connected between bit line $BL_k$ for column k of the array, and the top plate of ferroelectric capacitor 14; the gate of transistor 15 is controlled by word line $WL_j$ for row j of the array. The bottom plate of ferroelectric capacitor 14 is connected to plate line PL for the row, or which may be in common for all cells 12 in the array or array portion, depending on the architecture. As such, 1T-1C FRAM cells are constructed similarly as conventional dynamic RAM memory cells. Sense amplifier $16_k$ is coupled to bit line $BL_k$, and operates to compare the bit line voltage developed by read current $i_R$ to a reference voltage $V_{REF}$ generated by a reference voltage generator, or at a "dummy" bit line as may be produced by a reference capacitor, as known in the art. This reference voltage $V_{REF}$ is typically at an intermediate level between the expected voltages for the "0" and "1" data states.

In comparing the 1T1C and 2T2C FRAM cell architectures, the 1T1C cell has the advantage of increased bit density but the disadvantage of reduced read margin because of its single-ended sense relative to a reference voltage, while the 2T2C cell provides the advantage of robust data retention from complementary data storage and differential sensing, but at only about one-half the bit density.

As mentioned above, FRAM non-volatile memory has become popular for use in many electronic systems. So-called "system-on-a-chip" (SoC) devices, such as the MSP430 family of microcontrollers available from Texas Instruments Incorporated, now often include FRAM resources, particularly when used to realize sensors and controllers deployed in remote locations and thus in which power consumption is a particular concern. Zwerg et al., "An 82 mA/MHz Microcontroller with Embedded FeRAM for Energy-Harvesting Applications", *Digest of Technical Papers*, 2011 *Int'l Solid-State Circ. Conf.*, paper 19.2 (IEEE), pp. 334-36, incorporated herein by this reference, describes an example of such a microcontroller-based SoC. The networking of these and similar SoC devices according to the so-called "Internet of Things" (IoT) is becoming widespread.

Particularly in those networked implementations, FRAM is often used to store the microcontroller "firmware", including executable program code according to which the particular sensor or controller carries out its desired function. Considering the expected system life of these remotely-deployed IoT devices, SoC architectures typically include some provision for updating that system firmware, including the ability to verify the newly-received updated firmware prior to its installation to ensure post-update operability. In conventional architectures, a buffer in the memory space is necessary to store the updated firmware during this verification, prior to overwriting the existing firmware image in FRAM. Of course, this buffer necessitates the realization of additional memory in the SoC device, which increases the chip area and thus the manufacturing cost of the device, as well as potentially impacting the power consumption of the SoC. In some system architectures, an additional memory device (e.g., RAM), external to the SoC device, is provided as a buffer for storing updated firmware prior to validation. While avoiding the cost of implementing the additional buffer in the SoC device, this external buffer of course increases the cost and complexity of the overall system.

By way of further background, FRAM architectures in which the memory cells can be selectively operated in either of the 2T2C or 1T1C modes are known in the art. An example of such an architecture is described in U.S. Pat. No. 5,571,628, incorporated herein by reference. In the example of U.S. Pat. No. 5,571,628, a control signal selects whether an additional row address line is to be decoded, in which case the FRAM cells are operated (i.e., written and read) as 1T1C cells. For a read cycle in the 1T1C mode, a dummy word line is activated to couple a reference memory cell capacitor to the opposite bit line from that to which the addressed 1T1C cell is coupled; the sense amplifier then senses the data state of the addressed 1T1C cell by comparison with the bit line voltage produced by the reference memory cell capacitor. Conversely, for a read cycle in the 2T2C mode, the dummy word line is not activated; rather, two word lines are activated to couple cells in adjacent rows and the same column to opposing bit lines, for differential sensing by the sense amplifier.

BRIEF SUMMARY OF THE INVENTION

It is an object of certain embodiments to provide a large-scale integrated circuit and that includes programmable logic with the ability to update its firmware without requiring an additional buffer.

It is a further object of certain embodiments to provide a method of updating the firmware of such an integrated circuit in a manner that does not require the use of an additional buffer to store the updated content prior to verification.

It is a further object of certain embodiments to provide such a circuit and method that provides the ability to so update the firmware using non-volatile read/write memory.

Other objects and advantages of the embodiments described in this specification will be apparent to those of ordinary skill in the art having reference to the following specification together with its drawings.

An embodiment may be realized into an integrated circuit including a ferroelectric random access memory (FRAM) resource for storing executable code for the programmable logic, and logic circuitry and a corresponding method for updating the contents of the FRAM. The FRAM is constructed to selectively operate as a 2T2C FRAM memory in a normal operating mode and as a 1T1C FRAM memory in an update mode. To update the FRAM contents, its operating mode is changed to the update (1T1C) mode by the memory controller logic, and updated data are written into one of the 1T1C half-cells at each of a plurality of memory locations, while the original data are stored in the other 1T1C half-cell at each of those memory locations. Following verification of the updated contents, the original data in the complementary half-cells are overwritten with the verified updated data, and the operating mode is changed back to the normal (2T2C) operating mode.

DETAILED DESCRIPTION OF THE INVENTION

This invention will be described in connection with certain of its embodiments, namely as implemented into a large-scale integrated circuit such as a so-called "system on a chip" or "SoC", as it is contemplated that the invention will be particularly beneficial in such an application. However, it is further contemplated that the invention may be beneficially implemented in other applications and for other uses. Accordingly, it is to be understood that the following description is provided by way of example only, and is not intended to limit the true scope of this invention as claimed.

Figure 3:
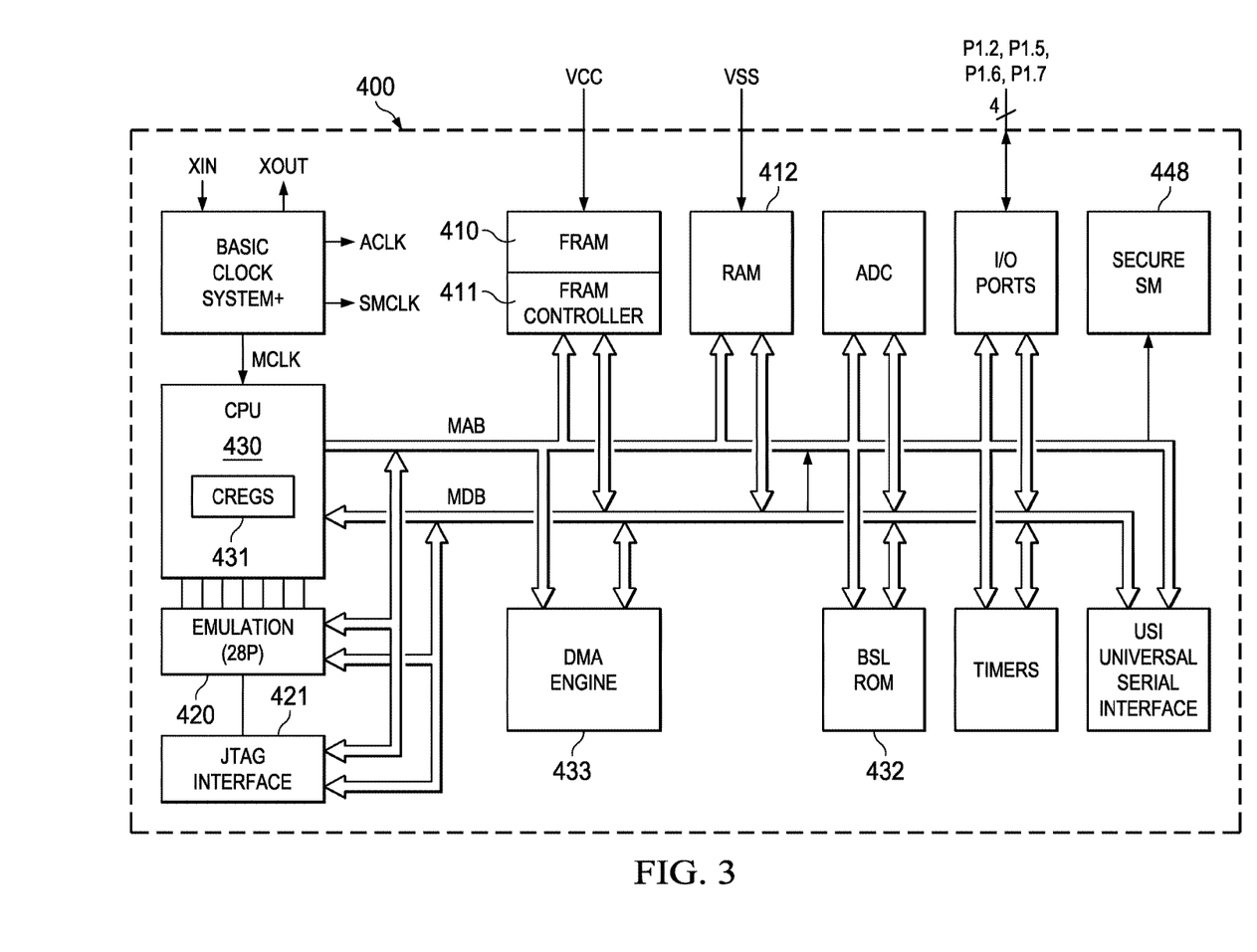
FIG. 3 is an electrical diagram, in block form, of the architecture of an SoC device constructed according to embodiments.

FIG. 3 illustrates, in block diagram form, the generalized architecture of SoC 400 constructed according to these embodiments. In this example, programmable logic serving as the central processing unit (CPU) of SoC 400 is provided by CPU 430, which may be realized, for example, by a microprocessor such as an ARM processor, or by a 16-bit RISC processor core as utilized in the MSP430 family of microcontrollers available from Texas Instruments Incorporated. As known in the art, SoC 400 may be constructed to include multiple CPUs 430, which may be of the same type as one another or which may be processors of other types such as generic programmable processors, digital signal processors (DSPs) or other application-specific or customized logic, including fixed sequence generators, as appropriate for the particular function of SoC 400. As shown in FIG. 3, CPU 430 may include one or more banks of registers, including control registers 431.

Memory resources in SoC 400 are provided by ferroelectric random access memory (FRAM) 410, read-only memory (ROM) 432, and random access memory 412, a portion of each of which is accessible to CPU 430 by way of main address bus MAB and main data bus MDB. While FRAM 410, ROM 432, and RAM 412 are shown in FIG. 3 as unitary blocks, these memory resources may alternatively be realized as multiple memory blocks or arrays; RAM 412, in particular, may be realized by any one or more of a number of memory cell types and arrangements, including static RAM (SRAM), dynamic RAM (DRAM), and the like. FRAM 410 in this embodiment is coupled to buses MAB, MDB via FRAM controller logic 411, the function and operation of which in connection with the updating of the contents of FRAM 410 will be described in detail below. Because of non-volatility and low power consumption, FRAM 410 is well-suited for storing the "firmware" of SoC 400, such firmware constituting the executable program code for one or more applications carried out by SoC 400 in its normal operation. It is this firmware that will be updated in the examples described in this specification, illustrating the operation of these embodiments. ROM 432 in this architecture serves as "bootloader" memory ("BSL"), and as such stores program code that is executable by CPU 430.

In addition to the various memory resources 410, 412, 432 that are accessible via address bus MAB and data bus MDB, it is contemplated that many of the circuit functions within SoC 400 may themselves include local memory resources that are not directly accessible to CPU 430. As noted above in connection with control registers 431, CPU 430 itself may also include local memory resources, for example one or more levels of cache memory as known in the art.

Various peripheral functions of SoC 400 may be also coupled to buses MAB, MDB, so as to be accessible to CPU 430 and one another. In the architecture of FIG. 3, these peripherals include direct memory access (DMA) engine 433 for providing DMA access to and from the various memory resources of SoC 400, various signal processing functions such as analog-to-digital (ADC) and digital-to-analog (DAC) converters, communications ports, timers, serial and other interface functions, and the like. These various peripheral functions may be within the address space of SoC 400, as suggested by their accessibility via buses MAB, MDB; alternatively, one or more of these or other functions may be accessible to CPU 430 directly or via other functional circuitry, as known in the art. Security features may also be realized within SoC 400, for example by way of secure state machine 448 in combination with stored security parameters in one or more secure memory resources, so as to execute features such as preventing data reads or writes to areas of memory that are specified to be secure areas unless a secure mode is enabled. SoC 400 also includes other functions such as its clock system, as well as emulation system 420 and JTAG interface 421 for debug and emulation, also as known in the art.

Those skilled in the art having reference to this specification will recognize that SoC 400 may include additional or alternative functions to those shown in FIG. 3, or may have its functions arranged according to a different architecture from that shown.

Figure 4:
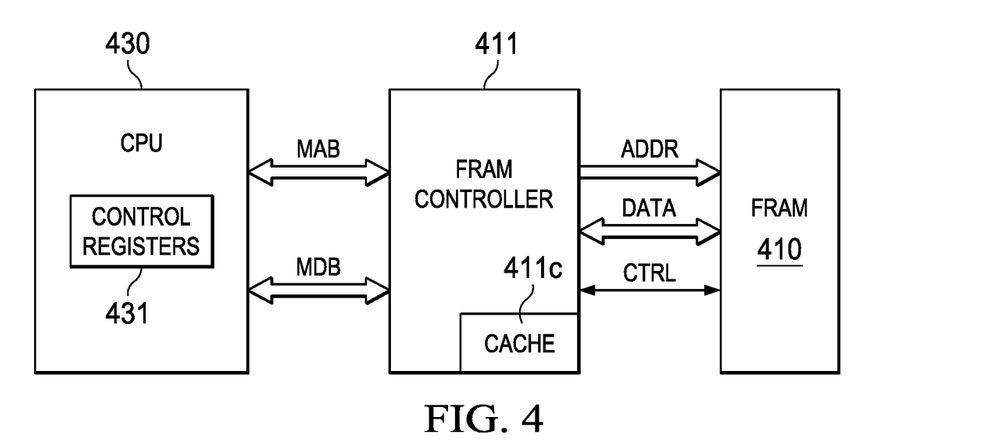
FIG. 4 is an electrical diagram, in block form, of the architecture of an FRAM subsystem in the SoC device of FIG. 3, constructed according to embodiments.

Referring now to FIG. 4, the architecture of an FRAM subsystem according to an embodiment, and incorporated into the architecture of SoC 400 of FIG. 3 by way of example, will be described. This architecture includes those functions involved in the updating of the contents of FRAM 410, particularly for the example of the updating of firmware stored in FRAM 410. FRAM 410 in this architecture is coupled to receive memory addresses from FRAM controller 411, and to communicate data and control signals to and from FRAM controller 411. FRAM controller 411 is coupled to receive addresses from CPU 430 via main address bus MAB, and to communicate data with CPU 430 via main data bus MDB. CPU 430 may also communicate control information to FRAM controller 411 via buses MAB, MDB, for example by writing that control information to memory addresses corresponding to control registers within FRAM controller 411. As will be described further below, FRAM controller 411 may also include internal memory in the form of cache 411c, as shown in FIG. 4; this cache 411c may be used in the updating of FRAM 410 as well as a higher-level cache in SoC 400 during its normal operation (e.g., as an instruction cache for firmware instructions previously retrieved by FRAM controller 410 from FRAM 410).

According to this embodiment, the control signals communicated from FRAM controller 411 to FRAM 410 include one or more control signals indicating the particular operating mode of FRAM 410. FRAM 410 includes an array of ferroelectric memory cells arranged in rows and columns in the conventional fashion, such as discussed above relative to FIG. 2b, along with sense amplifiers, address decoders, and other conventional peripheral circuitry (to the extent not included within FRAM controller 411 in this example). In this embodiment, however, FRAM 410 is constructed so that its memory cells can operate either as two-transistor two-capacitor (2T2C) ferroelectric cells or as one-transistor one-capacitor (1T1C) ferroelectric cells. In a general sense, as will be discussed in more detail below, FRAM 410 will operate as a 2T2C ferroelectric memory in a normal operating mode of SoC 400 to obtain the data retention and excellent read margin provided by that cell architecture, and will operate as a 1T1C memory in an update mode to temporarily enjoy the doubled capacity provided by that cell architecture.

Figure 5:
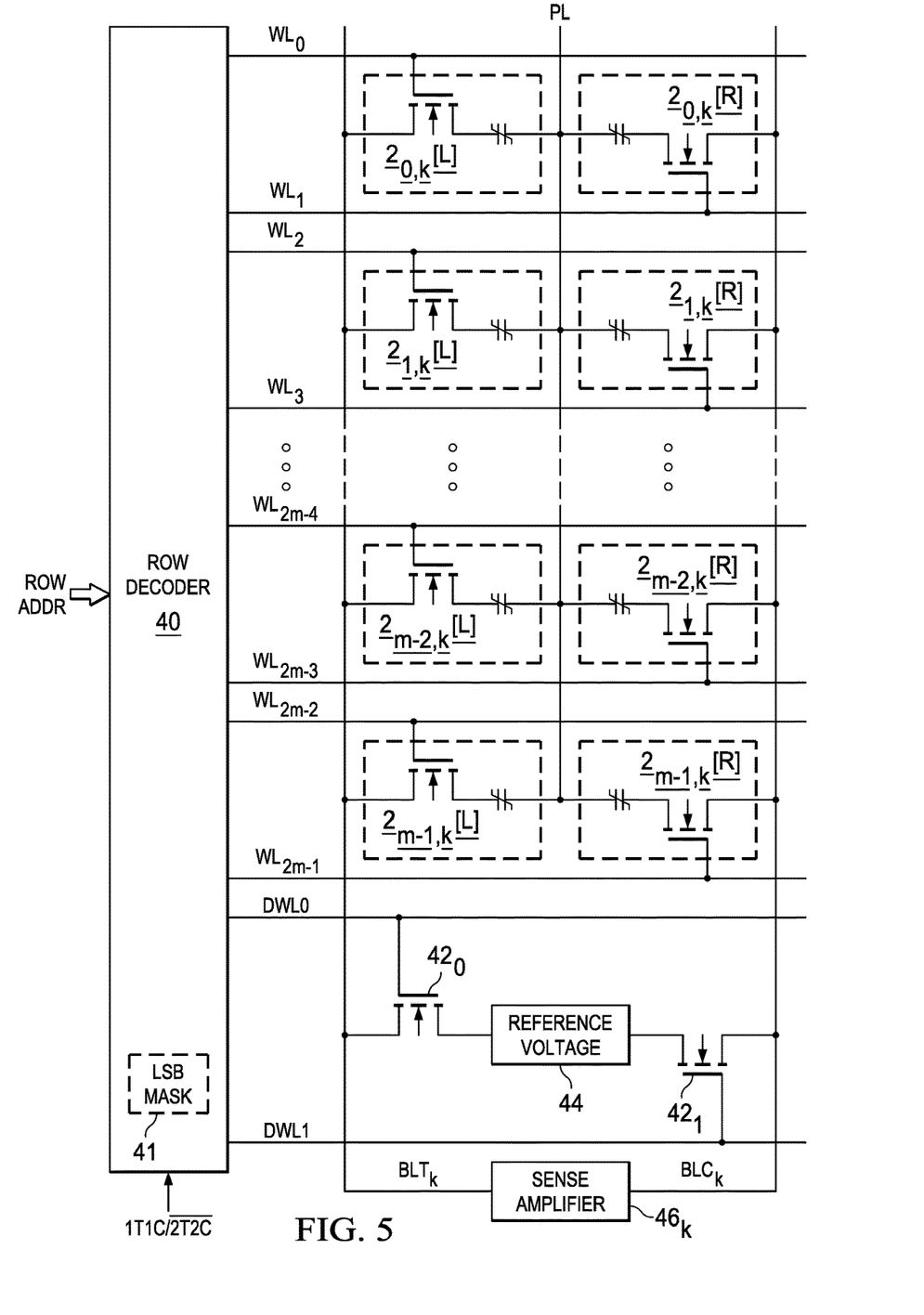
FIG. 5 is an electrical diagram, in schematic and block form, illustrating an arrangement of a portion of the FRAM array in the architecture of FIG. 3, according to an embodiment.
Figure 6:
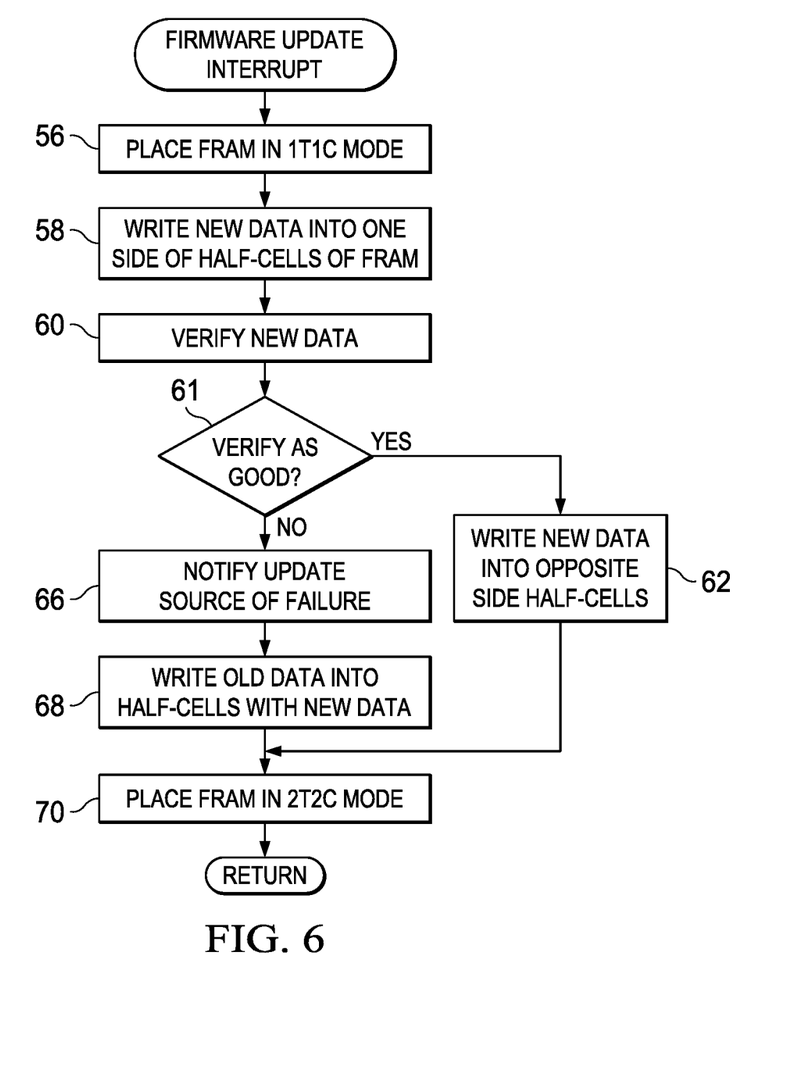
FIG. 6 is a flow diagram illustrating the operation of updating the contents of the FRAM array according to an embodiment.

As mentioned above in connection with the Background of the Invention, the construction of an FRAM array and peripheral circuitry so that it can selectably operate in either the 2T2C or 1T1C mode is known in the art. FIG. 5 illustrates an example following the approach of the above-incorporated U.S. Pat. No. 5,751,628, which is of a construction that may be used in connection with this embodiment; of course it is contemplated that this selectability between the two operating modes may be implemented in various ways. In this example, FIG. 5 illustrates a portion of a column k in an array of m rows and n columns of 2T2C FRAM cells $2_{j,k}$, where j indicates the one of the m 2T2C rows in which a given cell $2_{j,k}$ resides. Of course, the full array will include other columns of similarly arranged FRAM cells. Each 2T2C cell $2_{j,k}$ is shown as having first and second half-cells, each including a ferroelectric capacitor coupled between plate line PL and a pass transistor in the conventional manner. These two half-cells in this example will be referred to as left and right half-cells $2_{j,k}[L]$ and $2_{j,k}[R]$, respectively. Complementary (in the 2T2C sense) bit lines $BLT_k$, $BLC_k$ are coupled to the pass transistor of the left-hand and right-hand cells 2 in column k, and to sense amplifier $46_k$ for column k. Sense amplifier $46_k$ is a conventional differential sense amplifier, which in a read operation from column k forwards a data state signal (not shown) responsive to the comparison of the voltages at its bit lines $BLT_k$, $BLC_k$. The writing of data into cells 2 of FRAM 410 is performed in the conventional manner, according to the particular mode (2T2C or 1T1C) of operation.

In this construction, the pass transistors of the left half-cell $2_{j,k}[L]$ and the right half-cell $2_{j,k}[R]$ receive separate word lines at their gate electrodes. For example, left half-cell $2_{0,k}[L]$ receives word line $WL_0$ from row decoder 40, while right half-cell $2_{0,k}[R]$ receives word line $WL_0$. Similarly, the left half-cells $2_{j,k}[L]$ receive even-numbered word lines $WL_2$, $WL_4$, ..., $WL_{2m-4}$, $WL_{2m-2}$, while the right half-cells $2_{j,k}[R]$ receive odd-numbered word lines $WL_3$, $WL_5$, ..., $WL_{2m-3}$, $WL_{2m-1}$ from row decoder 40. FRAM controller 411 provides to row decoder 40 a row address selecting one of the m rows of 2T2C cells, and having an additional, least significant, bit that can selects between the left half-cell and right half-cell of the selected 2T2C row. FRAM controller 411 also provides, to row decoder 40 in this example, a control signal 1T1C/$\overline{2T2C}$ indicating whether FRAM 410 is to operate in its 1T1C or 2T2C modes. It is contemplated that the configuration of the FRAM subsystem of FIG. 4 is set by CPU 430 storing the appropriate values in control registers of FRAM controller 411, in response to which FRAM controller 411 issues the appropriate logic state of control signal 1T1C/$\overline{2T2C}$ to FRAM 410 for the desired operating mode. Responsive to control signal 1T1C/$\overline{2T2C}$ indicating operation in the 2T2C mode, an LSB mask 41 is set in row decoder 40 such that the least significant bit of the row address is ignored in the generation of the word line signals, and both word lines (e.g., word lines $WL_0$ and $WL_1$ for the first row j=0) are energized in the access cycle. Conversely, in the 1T1C mode, LSB mask 41 will not be enabled, and the least significant bit of the row address will be included in the selection of a single word line. It is contemplated that those skilled in the art having reference to this specification will be readily able to select the desired configuration and operating mode of FRAM 410 in this manner, or according to other conventional approaches, without undue experimentation.

FRAM 410 according to this example implementation also includes reference voltage generator 44 for use in the 1T1C mode. Reference voltage generator 44 may be a conventional reference voltage circuit that produces a stable output voltage at a level between the expected "0" bit line voltage and the expected "1" bit line voltage of FRAM 410; alternatively, as described in the above-incorporated U.S. Pat. No. 5,751,628, reference voltage 44 may be constructed as a pair of ferroelectric capacitors, either sized or polarized so as to produce a bit line voltage at the desired reference level. Pass transistors $42_0$, $42_1$ couple reference voltage generator 44 to bit lines $BLT_k$, $BLC_k$, respectively, when turned on by dummy word lines DWL0, DWL1, respectively, from row decoder 40. In this example, row decoder 40 energizes dummy word line DWL0 to connect reference voltage generator 44 to bit line $BLT_k$ responsive to the LSB of the row address selecting a right half-cell $2_{j,k}[R]$ (i.e., LSB=1), and energizes dummy word line DWL1 to connect reference voltage generator 44 to bit line $BLC_k$ responsive to the LSB of the row address selecting a left half-cell $2_{j,k}[L]$ (i.e., LSB=0). In this way, sense amplifier $46_k$ performs single-ended sensing of a selected half-cell in column k with FRAM 410 in the 1T1C mode.

Referring now to FIGS. 6 and 7a through 7f, the operation of an FRAM subsystem in an SoC device, such as SoC 400, according to an embodiment will now be described. In particular, this example of the operation of this FRAM subsystem will be described in the context of the updating of firmware for SoC 400 as stored in FRAM 410, as it is contemplated that this embodiment is especially beneficial when used in such an application. However, it is contemplated that this same process and operation may be used in updating contents of the FRAM memory other than the system firmware. In the architecture of FIG. 4, it is contemplated that this updating process will be executed and controlled largely by FRAM controller 411, at the initiation and direction of CPU 430, for example in an interrupt handler routine that is invoked by an interrupt corresponding to the communication of an update. Of course, the particular logic circuits responsible for specific tasks and processes involved in the update may vary from this implementation, depending on the particular architecture of the device and its FRAM resource. It is contemplated that those skilled in the art having reference to this specification will be readily able to adapt this embodiment to such applications and alternative architectures.

In the firmware update context, an original or other prior version of the SoC firmware is initially stored in FRAM 410, and is used for normal system operation in which application software is executed or otherwise carried out by SoC 400, under that original firmware or previous update. Typically, this normal operation of SoC 400 is performed with FRAM 410 in its 2T2C mode, by FRAM controller 411 issuing control signal $1T1C/\overline{2T2C}$ at the appropriate level in response to CPU 430 having set the contents of the appropriate control register in FRAM controller 411 accordingly. As mentioned above, the operation of FRAM 410 in its 2T2C mode is suitable for long-term storage, with optimal read margin and robust data retention performance.

Figure 7A:
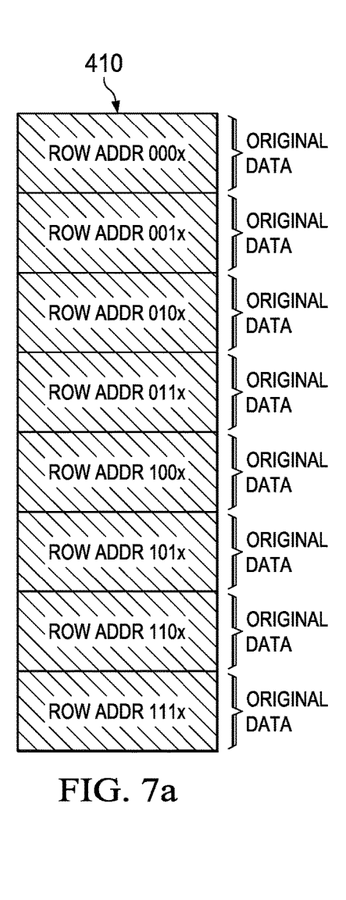
FIGS. 7a through 7f are block diagrams illustrating contents of the FRAM array in the architecture of FIG. 3 at various stages during the process of FIG. 6 according to that embodiment.

FIG. 7a illustrates an example of the contents of a portion of FRAM 410 containing the original firmware contents, and during its normal operation prior to receipt of a firmware update. In this example, eight rows of 2T2C cells in FRAM 410 are shown as storing the original firmware code. In the 2T2C mode of FRAM 410 constructed as described above relative to FIG. 5, these eight rows correspond to the 2T2C row addresses 000x through 111x, where the "x" indicates that the least significant bit that selects between the left half-cells and right-half cells is ignored (i.e., "masked" by LSB mask 41 of row decoder 40). Because of the differential operation of 2T2C FRAM cells as described above, the polarization state of each right half-cell $2_{j,k}[R]$ will be the logical complement of the state of its corresponding left half-cell $2_{j,k}[L]$. As such, one may consider the original firmware code stored as two copies in FRAM 410: one copy in the left half-cells and the other stored as complementary data in the right half-cells.

As conventional in the art, SoC 400 is able to receive updated software, including updates to the firmware stored in FRAM 410, either asynchronously or upon initiation of a firmware update ("flash") by a user or from a host network node. In this embodiment, upon SoC 400 receiving an indication of updated firmware, a firmware update interrupt is invoked, and the interrupt handler routine of FIG. 6 according to this embodiment is executed.

Figure 7B:
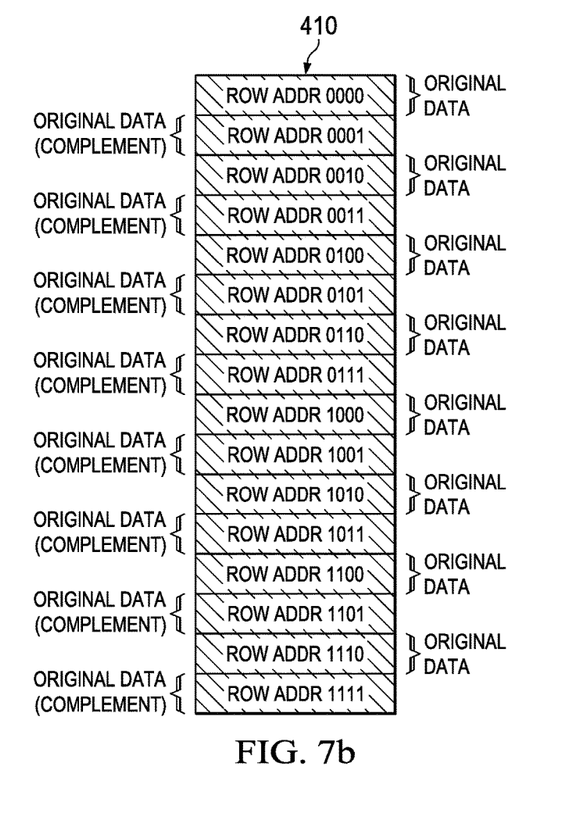

According to this embodiment, the firmware update interrupt handler begins with process 56, in which FRAM controller 411 places FRAM 410 into its update mode. In these embodiments, the update mode entered in process 56 causes FRAM 410 to consider and operate its cells 2 as 1T1C FRAM cells, and operate row decoder 40, sense amplifiers 46, and other peripheral circuitry of FRAM 410 as appropriate for a 1T1C FRAM. In the architecture of FIG. 5, for example, LSB mask 41 in row decoder 40 is disabled, allowing the activation of one of dummy word lines DWL0, DWL1 in each cycle in response to the value of the row address least significant bit. Referring to FIG. 7b, the 2T2C rows of FRAM 410 as shown in FIG. 7a are now considered as pairs of half-rows, or 1T1C rows that are selectable based on the state of the least significant row address bit, and that store complementary data relative to one another. For example, 1T1C row address 0000 corresponds to the left half-cells $2_{0,k}[L]$ of the first 2T2C row j=000x, and 1T1C row address 0001 corresponds to the right half-cells $2_{0,k}[R]$ of that first 2T2C row j=000x. The data stored in 1T1C row 0001 is the logical complement of that stored in 1T1C row 0000; this complementary data by alternating 1T1C rows continues throughout FRAM 410 as shown in FIG. 7b. Essentially, the memory capacity of FRAM 410 is doubled in this 1T1C mode as compared with the 2T2C mode, but at this point in the process is storing two copies of the same data.

Optionally, prior to the placing of FRAM 410 into the 1T1C mode in process 56, the original data stored in FRAM 410 may be "refreshed" by reading and then rewriting the same data back into each cell in the array. This refreshing of the contents of FRAM 410 may be useful to re-establish a full polarization state for each bit of the stored data, considering that subsequent operations will be reading these stored contents of single-ended sensing in the 1T1C mode. If desired, this refreshing may be performed at an elevated power supply voltage, such as used in some FRAM test operations and modes, to boost the polarization states for the stored data.

Figure 7C:
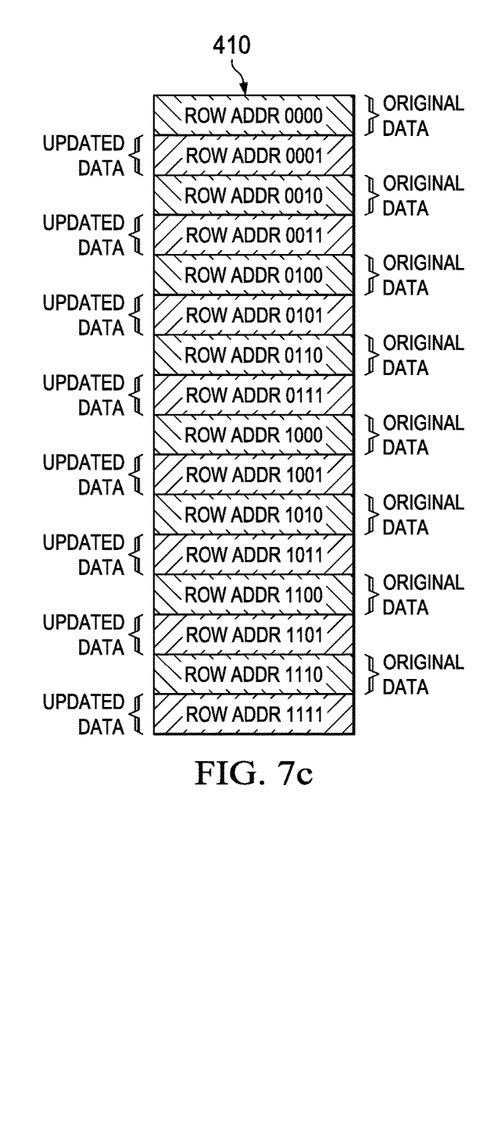

In process 58, the new data corresponding to the updated firmware for SoC 400 are received and written into the half-cells on one side of each FRAM cell 2 in FRAM 410. In this example, these updated data are stored in the right half-cells of FRAM 410, in the 1T1C rows having a "1" in the least significant row address bit (i.e., at row addresses $a_3a_2a_1 1$), as shown in FIG. 7c. The effective doubling of the capacity of FRAM 410 by the switching into the 1T1C mode provides essentially a full-size buffer to receive firmware updates and other new data, without requiring additional memory cells in SoC 400 for that buffer. Of course, the updated firmware need not necessarily fill the available buffer provided by the alternate 1T1C rows.

The writing of the updated data into the alternate 1T1C rows in process 58 may be performed in various ways. In this example, since the updated data are written into the right half-cells associated with the complementary bit line $BLC_k$ of each column k, these updated data may be written as the logical complement of the actual updated data. Alternatively, the data may be written into the right half-cells as the true data states (i.e., as received). Of course, the updated data may instead be written into the left half-cells in process 58 and the previous version retained in the right half-cells. In any case, subsequent processes will comprehend the true or complement states of these data. In addition, the actual write cycles of process 58 may be performed at an elevated power supply voltage, such as used in some FRAM test operations and modes, to boost the polarization states for the stored data in light of the reduced read margin inherently provided by 1T1C FRAM cells relative to 2T2C cells.

Following the writing of the updated data (e.g., firmware) to alternate 1T1C rows in process 58, these updated data are then verified by CPU 430 in the appropriate manner in process 60 to ensure that the updated data were accurately received and stored. According to this embodiment, verification process 60 will be performed by CPU 430 or another logic circuit in SoC 400 executing some type of numerical data verification routine on the stored updated data. Any one of a number of conventional numerical data verification techniques, such as evaluation of a cyclic redundancy check (CRC), hashes, cryptographic hashes, check sums, and the like, may be used in process 60. This verification will typically involve the retrieval by FRAM controller 411 of the updated data from the alternate rows (row addresses $a_3a_2a_1 1$ of FIG. 7c) in which it was stored in process 58, along with the execution of the appropriate verification calculations by CPU 430 or other computational logic in SoC 400, as desired.

Figure 7D:
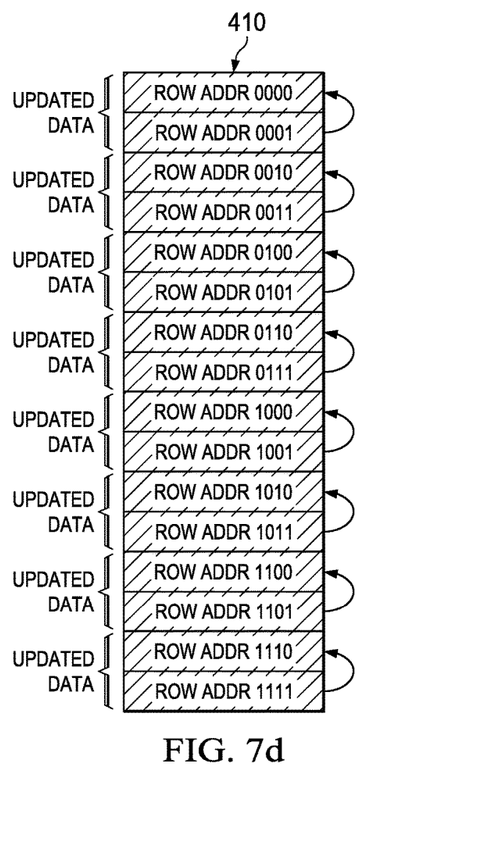
Figure 7E:
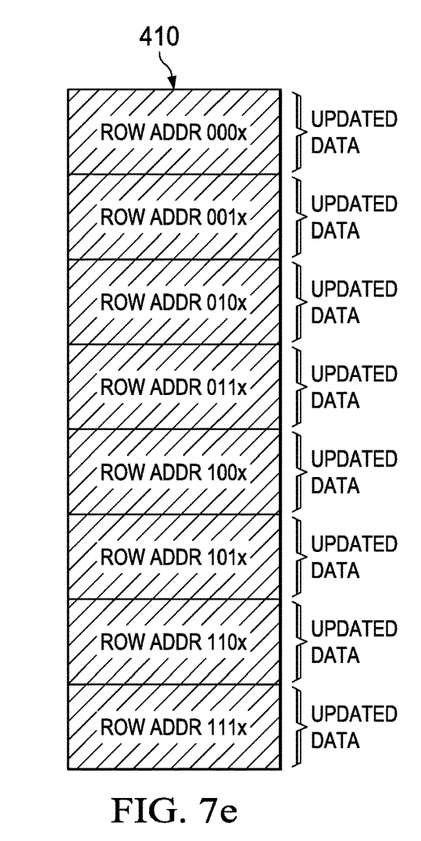

Decision 61 determines whether the verification of process 60 was successful, indicating that the updated data written into the alternate rows of FRAM 410 is free of errors (or at least may be corrected using conventional error correction) and may be trusted as true and accurate. If so (decision 61 is "yes"), these updated data are copied into the paired alternate rows of FRAM 410 in process 62, overwriting the original data in those locations. FRAM 410 is of course still in its 1T1C update mode for this process 62. As shown in FIG. 7d, the overwriting of process 62 retrieves the data stored in the right half-cells of a given 2T2C row (e.g., row address 0001) and writes those same data into the left half-cells of the same 2T2C row (e.g., into row address 0000). This overwriting of process 62 is performed for all of the other rows in FRAM 410 that contain the updated firmware or other data. In this example, the contents at each row address $a_3a_2a_1 1$ are copied into the cells at its paired row address $a_3a_2a_1 0$. Preferably, the overwriting of process 62 writes the logical complement of the updated data into the corresponding alternate 1T1C row, such that the data stored in row $a_3a_2a_1 0$ are the logical complement of the data stored in its companion row $a_3a_2a_1 1$. For the architecture of FIG. 5, it will be convenient for the polarity of the complement stored data to be consistent with the convention that the left half-cells are associated with the "true" bit lines $BLT_k$ and the right half-cells are associated with the "complement" bit lines $BLC_k$. In addition, the actual write cycles of process 62 may be performed at an elevated power supply voltage, such as used in some FRAM test operations and modes, to boost the polarization states for the stored data, considering the reduced read margin inherently provided by 1T1C FRAM cells relative to 2T2C cells.

The copying of the updated data from the alternate 1T1C rows (e.g., addresses $a_3a_2a_1 1$) into the paired alternate row addresses ($a_3a_2a_1 0$) in process 62 may be performed by hardware functions in SoC 400. Referring to the architecture of FIG. 4 by way of example, one hardware approach for performing this overwriting is to utilize FRAM controller 411 to read FRAM 410 and rewrite the complementary data back into FRAM 410 without involving CPU 430. In this approach, cache 411c may be used to temporarily store the contents retrieved from FRAM 410 in process 62, thus allowing the read and write of larger blocks of data from and to FRAM 410. Another hardware-based approach may utilize DMA engine 433 to retrieve the contents from the alternate 1T1C rows (e.g., addresses $a_3a_2a_1 1$) of FRAM 410 and then rewrite those contents into the paired alternate row addresses ($a_3a_2a_1 0$), without involving CPU 430. Alternatively, process 62 may be performed by CPU 430 executing software instructions, for example fetched from BSL ROM 432 or from FRAM 412 itself, to carry out the reads and writes involved in copying the contents from alternate rows into their corresponding paired rows. It is contemplated that those skilled in the art having reference to this specification will be readily able to implement the appropriate one of these and other approaches, including hybrids of these and other hardware and software-based techniques, as appropriate for particular applications and architectures, without undue experimentation.

Following the copying of updated data performed in process 62, the updating process completes according to this embodiment by FRAM controller 411 issuing control signal $\overline{1T1C/2T2C}$ at the appropriate level to place FRAM 410 into the 2T2C mode in process 70, following which a return from the interrupt is performed, and operation in the normal operating mode commences, under the updated firmware. Again, with FRAM 410 in the 2T2C mode, its cells 2 are then accessed on a row-by-row basis by way of row addresses $a_3a_2a_1 x$, in which the least significant bit is masked by LSB mask 41 of row decoder 40, and thus ignored in the decoding of the row address in this 2T2C mode. Execution of the appropriate applications of SoC 400 are then again carried out.

Figure 7F:
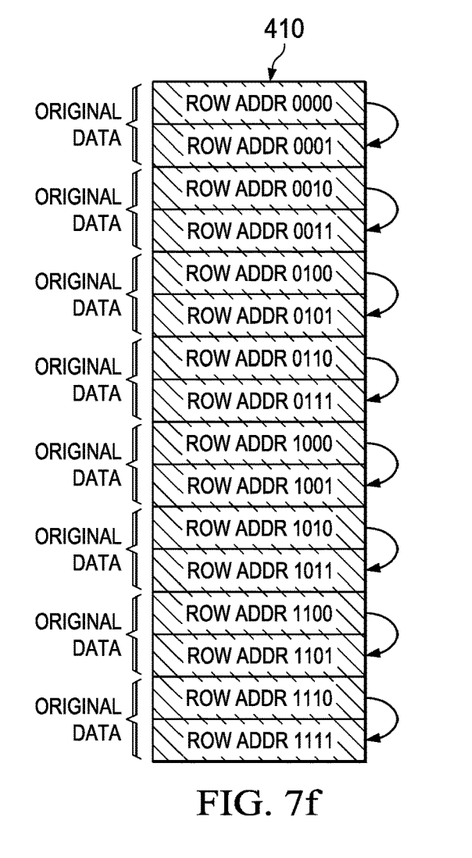

On the other hand, if the verification of the updated data (e.g., firmware) performed in process 60 is not successful, decision 61 returns a "no" result, indicating the detection of one or more uncorrectable errors in the updated firmware. As known in the art, such errors may occur in either the communication of the update over a network link, or in the storage or retention of the updated data by FRAM 410. In this event, process 66 is then executed to notify the source of the update of this failure, so that the update may be retransmitted if desired. The updated data stored in alternate rows of FRAM 410 are then considered as invalid, and will not be copied over from the alternate 1T1C rows (e.g., addresses $a_3a_2a_1 1$) of FRAM 410 into the paired alternate row addresses ($a_3a_2a_1 0$). Rather, the old data are copied over from the 1T1C rows of FRAM 410 storing that previous version (e.g., from row addresses $a_3a_2a_1 0$) into the cells at the alternate row addresses ($a_3a_2a_1 1$) that received the failed update, in process 68. FRAM 410 remains in the 1T1C update mode for this process 68. The particular data states written in process 68 will again be complementary to those of the corresponding addresses from which the old data is retrieved, consistent with the differential data storage and sensing of 2T2C FRAMs described above. This overwriting of process 68 may be performed at an elevated voltage, as described above, to optimize reliability of the stored data, and may be performed by either particular hardware or DMA logic in SoC 400 or by CPU 430 or other logic circuitry executing software routines for performing this process 68. FIG. 7f illustrates the overwriting of the old data in this process 68. Following the replacement of the previous version of the stored data as performed in this process 68, FRAM controller 411 issues the control signal $\overline{1T1C/2T2C}$ at the appropriate level to place FRAM 410 into the 2T2C mode in process 70, and a return from the firmware update interrupt handler is carried out. Normal operation of SoC 400 can then continue, awaiting a resend of the updated firmware or other data from the source end if such is performed.

According to these embodiments, the ability to efficiently receive and verify updated firmware and other program code or data in an integrated circuit including embedded non-volatile memory is provided. This ability is provided by temporarily reconfiguring ferroelectric memory from its 2T2C operating mode into a double-capacity, but less robust, 1T1C operating mode, for the time required to verify and copy the received updated data. By way of this approach, the robust read margin performance and excellent data retention provided by the differential data storage and sensing of 2T2C FRAM memory, which is well-suited for storing system software routines commonly contained within system firmware, is retained, while the doubled bit density of 1T1C FRAM memory is used to advantage in the update and verify process. Additional buffers, either in the integrated circuit itself or as an external memory device in the overall system, for receiving firmware updates through verification are therefore not necessary, reducing the cost and power consumption of the large-scale integrated circuit and the system in which it is implemented.

As evident from this specification, these embodiments are described above as constructed using ferroelectric memory technology. Alternatively, it is contemplated that these embodiments may alternatively be implemented in memories of a similar structure, but using a non-volatile storage technology other than the polarization of ferroelectric material. For example, these embodiments may be realized using memory cells that include a pair of magnetorestrictive random access memory (MRAM) storage elements coupled to separate conductors (e.g., bit lines) for differential sensing in one mode, but that in another operating mode may be separately written and sensed by way of those bit lines.

While the invention has been described according to certain of its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. An integrated circuit, comprising:
   a ferroelectric random access memory (FRAM) operable as a two-transistor two-capacitor (2T2C) memory in a normal operating mode, and as a one-transistor one-capacitor (1T1C) memory in an update mode, comprising:
      an array of memory cells arranged in rows and columns, the memory cells in each column coupled to first and second bit lines, and each memory cell in the array comprising first and second half-cells, each comprising a ferroelectric capacitor and a pass transistor; and
      a plurality of sense amplifiers, each associated with a column of memory cells and coupled to the first and second bit lines for that column; and
   logic circuitry configured to control the FRAM that contains a first data set stored as complementary polarization states in a plurality of the memory cells to update its contents by performing a sequence of operations comprising:
      placing the FRAM array into the update mode;
      writing a second data set in the second half-cell of each of a selected plurality of the memory cells;
      verifying the second data set;
      responsive to successfully verifying the second data set, writing a logical compliment of the second data set into the first half-cell of each of the selected plurality of memory cells; and
      then placing the FRAM array into the normal operating mode.

2. The integrated circuit of claim 1, wherein the FRAM further comprises:
   decode circuitry configured to decoding a row address value and energizing a word line for a row of the array of memory cells responsive to the row address value;
   wherein, for each row of memory cells, the pass transistor of each of the first half-cells in that row couples a plate of its ferroelectric capacitor to the first bit line responsive to a first word line signal, associated with a first row address value, shared among the first half-cells of the memory cab in the row;
   wherein, for each row of memory cells, the pass transistor of each of the second half-cells in that row couples a plate of its ferroelectric capacitor to the second bit line responsive to a second word line signal, associated with a second row address value, shared among the second half-cells of the memory cells in the row;
   wherein the first and second row address values for the same row differ from one another by a single row address bit.

3. The integrated circuit of claim 2, wherein the logic circuitry is further configured to control the FRAM, in the normal operating mode, to read the contents of one or more memory cells by a sequence of operations comprising:
   applying a row address to the decode circuitry;
   controlling the decode circuitry to select a row of the array of memory cells corresponding to the row address while masking the single row address bit; and
   operating one or more of the plurality of sense amplifiers to sense a differential signal between the first and second bit ones;
   and wherein, in the update mode, the verifying operation comprises reading the second data set from the second half-cells of the selected plurality of memory cells by:
   applying a row address to the decode circuitry;
   controlling the decode circuitry to select a row of the array of memory cells corresponding to the row address including the single row address bit; and
   operating one or more of the plurality of sense amplifiers to compare a signal at the second bit line with a reference voltage.

4. The integrated circuit of claim 3, wherein the FRAM further comprises:
   circuitry for coupling a reference voltage to one of the first and second bit lines of each of the columns in the update mode, responsive to the single row address bit.

5. The integrated circuit of claim 3, further comprising:
   programmable logic, configured to execute program instructions stored in and retrieved from the FRAM;
   and wherein the logic circuitry comprises memory controller logic for controlling the FRAM to update its contents, and for storing and retrieving data in and from the FRAM in the normal operating mode.

6. The integrated circuit of claim 3, wherein the sequence of operations further comprises:

responsive to the verifying operation indicating an error in the second data set, writing the first data set into the second half-cell of each of the selected plurality of memory cells.

7. The integrated circuit of claim 6, wherein the verifying operation comprises;
   reading the second data set from the second half-cells of the selected plurality of memory cells; and
   executing a numerical data verification on the second data set as read.

8. An integrated circuit, comprising:
   a non-volatile memory, comprising:
      an array of memory cells arranged in rows and columns, each memory cell comprising first and second half-cells that each comprise a non-volatile memory element, the first half-cell coupled to a first bit line when accessed, and the second half-cell coupled to a second bit line when accessed, the first and second bit lines shared by memory cells in the same column of the array; and
      a plurality of sense amplifiers, each associated with a column of memory cells and coupled to the first and second bit lines for that column; and
   logic circuitry configured to control the memory that contains a first data set stored as complementary polarization states in a plurality of the memory cells to update its contents by performing a sequence of operations comprising:
      placing the memory into an update mode in which the first and second half-cells of each memory cell are separately accessed;
      writing a second data set in the second half-cell of each of a selected plurality of the memory cells;
      verifying the second data set;
      responsive to successfully verifying the second data set, writing a logical compliment of the second data set into the first half-cell of each of the selected plurality of memory cells; and
      then placing the memory into a normal operating mode in which the first and second half-cells of an accessed memory cell are coupled to the first and second bit ones, respectively, for the corresponding column.

* * * * *